United States Patent
Xu et al.

(10) Patent No.: US 9,763,362 B1
(45) Date of Patent: Sep. 12, 2017

(54) SERVER INCLUDING AN ARRANGEMENT OF DEVICES THEREIN

(71) Applicants: INVENTEC (PUDONG) TECHNOLOGY CORPORATION, Shanghai (CN); INVENTEC CORPORATION, Taipei (TW)

(72) Inventors: Ji-Peng Xu, Shanghai (CN); Jian-Jun Deng, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/239,175

(22) Filed: Aug. 17, 2016

(30) Foreign Application Priority Data

Aug. 5, 2016 (CN) .......................... 2016 1 0635345

(51) Int. Cl.
*H05K 7/20* (2006.01)
*H05K 7/14* (2006.01)

(52) U.S. Cl.
CPC ....... *H05K 7/20736* (2013.01); *H05K 7/1489* (2013.01); *H05K 7/1492* (2013.01); *H05K 7/1487* (2013.01)

(58) Field of Classification Search
CPC .. H05K 7/1489; H05K 7/1492; H05K 7/1487; H05K 7/20736
USPC .......................... 361/679.46–679.54, 688–727
See application file for complete search history.

(56) References Cited

U.S. PATENT DOCUMENTS

| | | | |
|---|---|---|---|
| 8,331,095 B2 * | 12/2012 | Hu | G06F 1/187 312/223.1 |
| 8,477,491 B1 * | 7/2013 | Ross | H05K 7/20736 361/679.48 |
| 8,811,020 B2 * | 8/2014 | Song | G06F 1/183 312/223.1 |
| 9,489,024 B2 * | 11/2016 | Tsai | G06F 1/26 |
| 2007/0211430 A1 * | 9/2007 | Bechtolsheim | H05K 7/20736 361/695 |
| 2014/0268546 A1 * | 9/2014 | Mayhall | G06F 1/20 361/679.47 |

* cited by examiner

*Primary Examiner* — Zachary M Pape
(74) *Attorney, Agent, or Firm* — Maschoff Brennan

(57) ABSTRACT

A server adapted to server cabinet having a fan assembly and a power supply. The server includes a chassis, a main board module, a data storage, a signal-transferring module and a docking module. The chassis has a bottom plate, a first side plate and a second side plate disposed on the bottom plate. The main board module is placed along the first side plate. The data storage module is placed along the second side plate. The signal-transferring module is placed along the first side plate. The signal-transferring module is located at the back of the main board module. The signal-transferring module is connected between the main board module and the data storage module. The docking module is disposed on the bottom plate. The docking module is connected to the data storage module and the signal-transferring module. The docking module is connectable to the power supply and the fan assembly.

10 Claims, 12 Drawing Sheets

SERVER INCLUDING AN ARRANGEMENT OF DEVICES THEREIN

CROSS-REFERENCE TO RELATED APPLICATIONS

This non-provisional application claims priority under 35 U.S.C. §119(a) on Patent Application No(s). 201610635345.3 filed in China on Aug. 5, 2016, the entire contents of which are hereby incorporated by reference.

BACKGROUND OF THE INVENTION

Technical Field of the Invention

The disclosure relates to a server, more particularly to a high-density server.

Description of the Related Art

With the development of technology and the spread of the Internet, cloud technology is used across several domains such as financial services, securities, consumer goods, IT & telecom, media and transportation.

It requires servers to run software and store data. However, the server storage capacity of a conventional server is not enough for requirements in recent years. Therefore, developers are seeking solution to increase server storage capacity for achieving a high-density server in order to fully use the space of the information center.

SUMMARY OF THE INVENTION

The present disclosure provides a high-density server. One embodiment of the disclosure provides a server adapted to a server cabinet. The server cabinet includes a fan assembly and a power supply. The server includes a chassis, a main board module, a data storage, a signal-transferring module and a docking module. The chassis has a bottom plate, a first side plate and a second side plate. The first side plate and the second side plate are respectively disposed on two opposite sides of the bottom plate. The main board module is disposed on the bottom plate and placed along the first side plate. The data storage module is disposed on the bottom plate and placed along the second side plate for accommodating a plurality of hard drives. Each of the plurality of hard drives is insertable into and removable from the data storage module along a first direction. The signal-transferring module is disposed on the bottom plate and placed along the first side plate. The signal-transferring module is located at the back of the main board module. The signal-transferring module is electrically connected between the main board module and the data storage module. The docking module is disposed on the bottom plate. The docking module is electrically connected to the data storage module and the signal-transferring module. The docking module is connectable to the power supply and the fan assembly of the server cabinet for heat dissipation and receiving electrical energy. The data storage module is operatable by being connected to the docking module, the signal-transferring module and the main board module.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
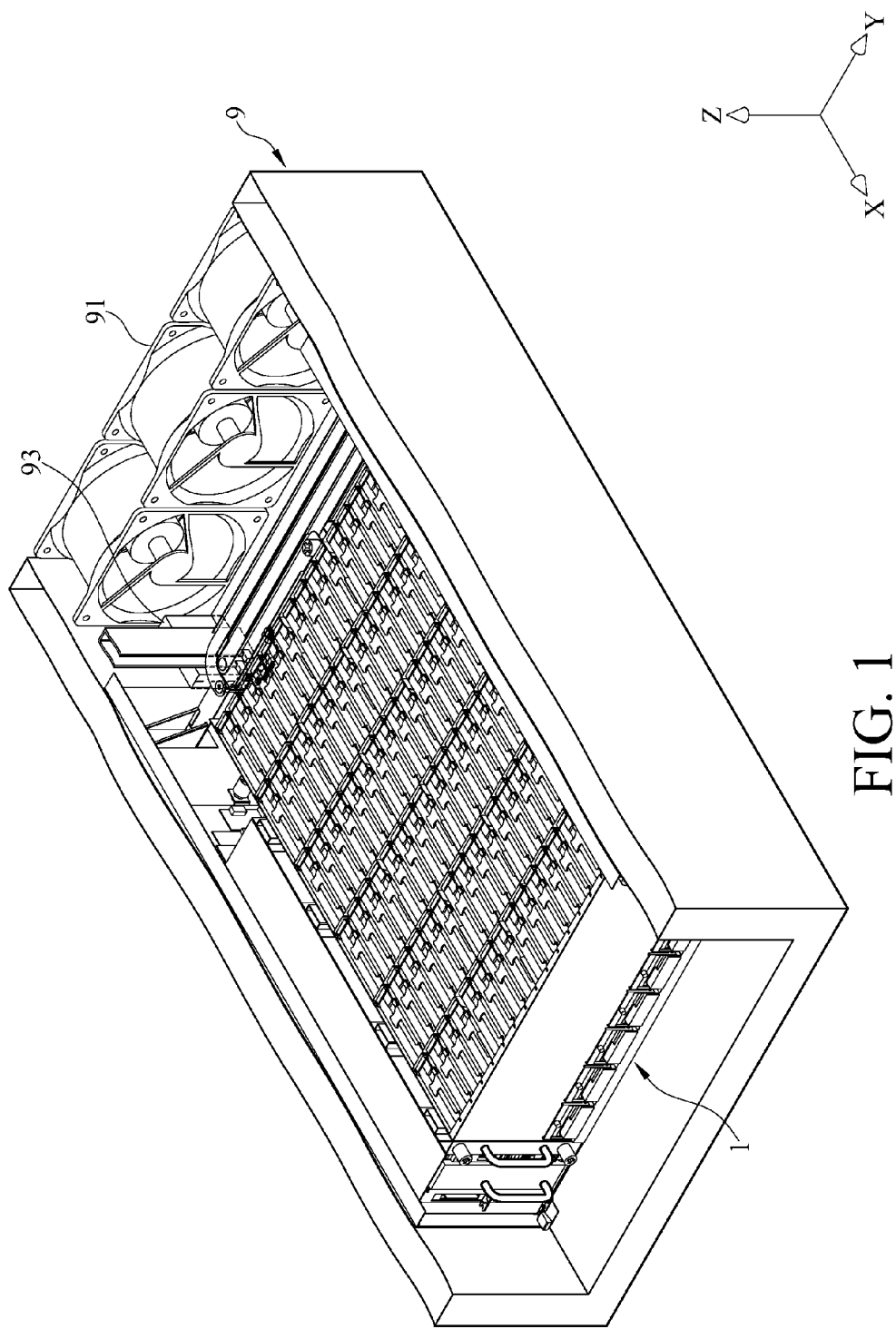
FIG. 1 is a perspective view of a server disposed in a server cabinet according to one embodiment of the disclosure.
Figure 2A:
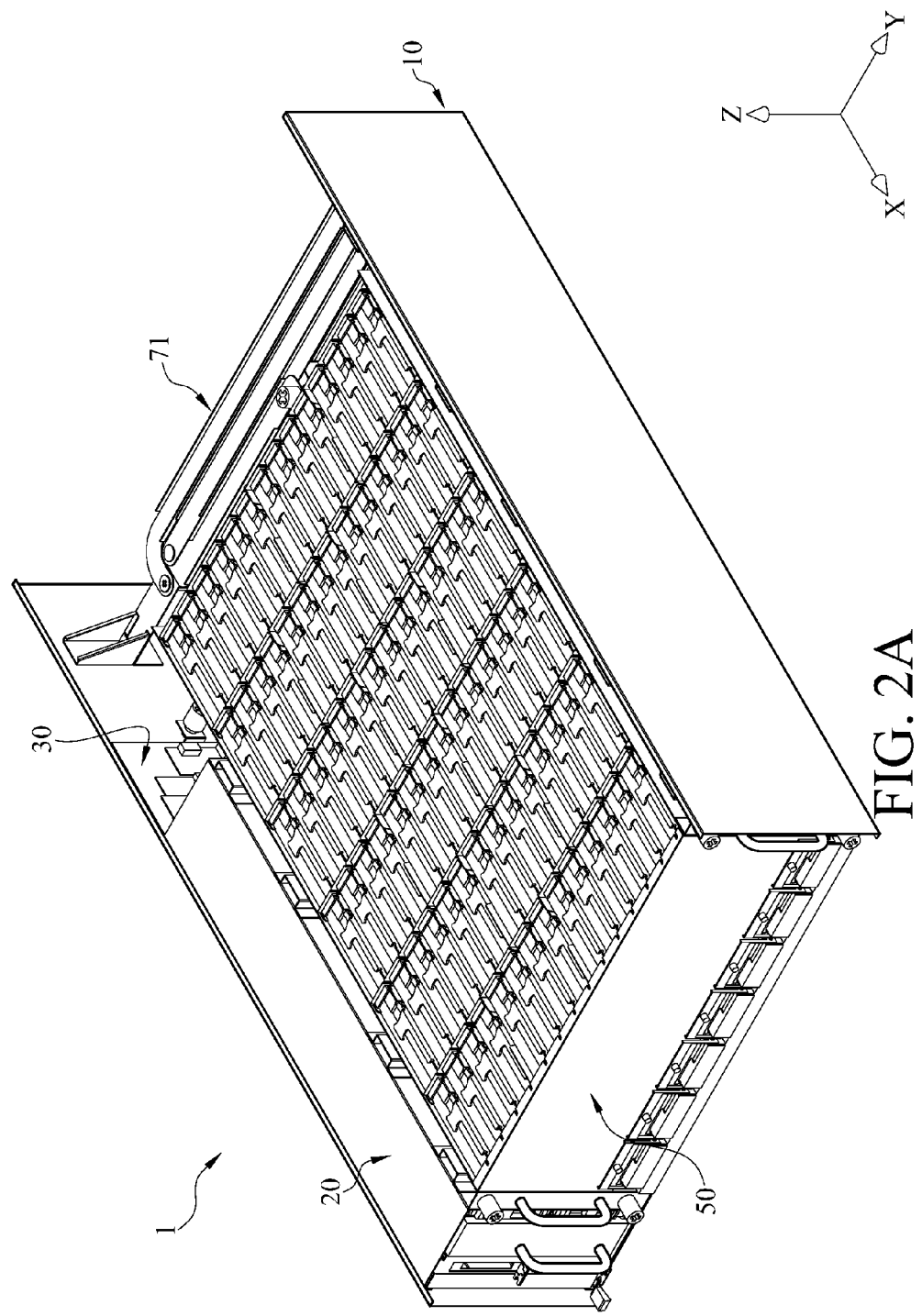
FIGS. 2A to 2B are perspective views of the server according to one embodiment of the disclosure taken from different viewpoints.
Figure 2B:
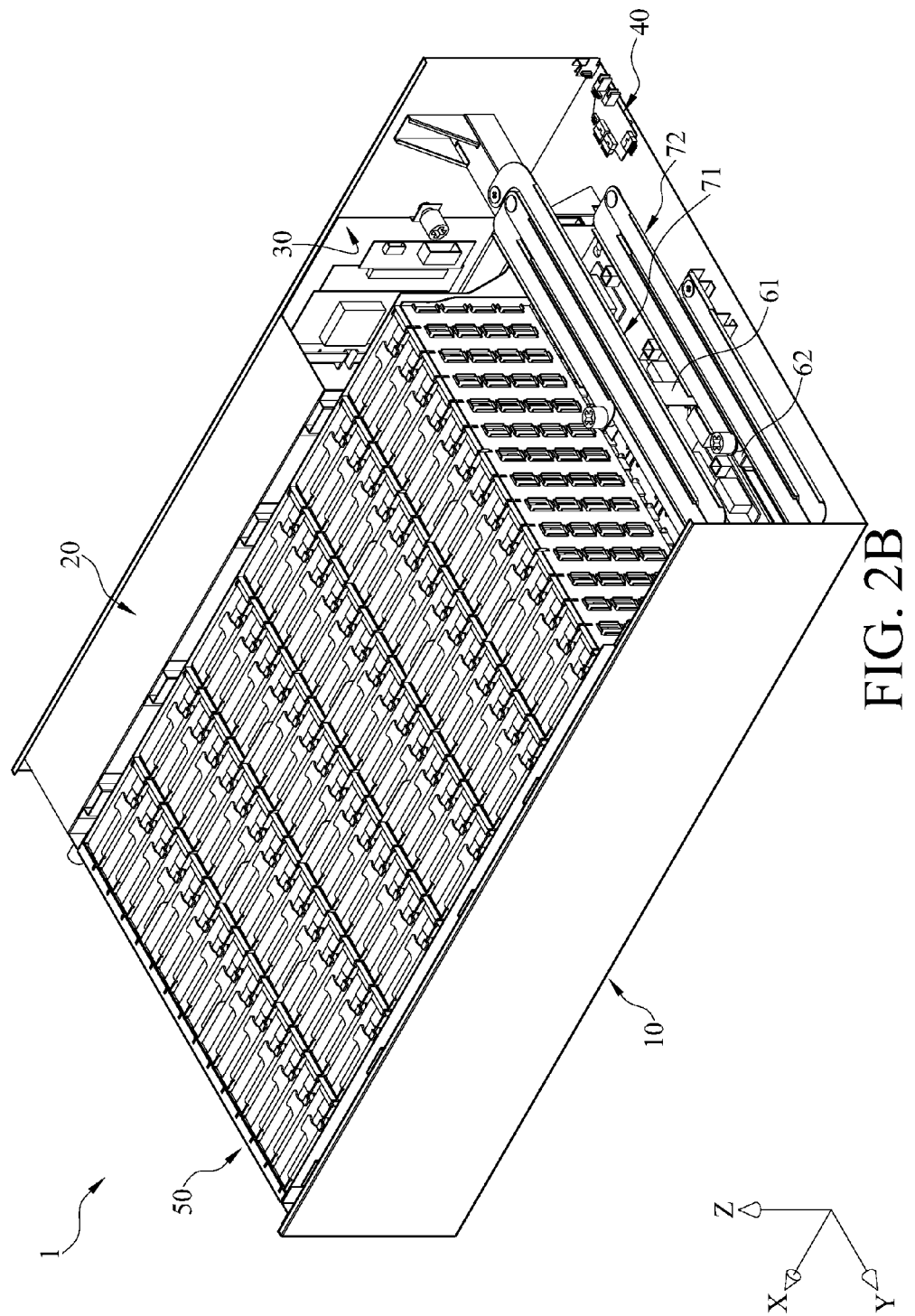

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, for the purpose of clarity, cables connected between electronic components that are known in the technical fields related to the disclosure are not shown in some of the figures. Furthermore, one skilled in the art will understand that reference to a particular coordinate system shown in figures is simply for the purpose of clarity as well, and does not limit the direction of the structures to a particular direction or a particular coordinate system.

Please refer to FIG. 1, which is a perspective view of a server disposed in a server cabinet according to one embodiment of the disclosure. This embodiment provides a server 1 adapted to a server cabinet 9. The server 1 is placed into the server cabinet 9. The server cabinet 9 can accommodate plural servers 1 according to actual requirements, but the disclosure is not limited thereto. In addition, the server cabinet 9 includes a fan assembly 91 and a power supply 93 corresponding to the server 1. When the server 1 is placed into the server cabinet 9, the fan assembly 91 can provide airflow to the server 1 for heat dissipation, and the server 1 is electrically connected to the power supply 93 for receiving electrical energy. Accordingly, it is noted that the server cabinet 9 has a central cooling system and a central energy supply system for reducing power consumption.

In addition, the server cabinet 9 further includes a server control module (not shown) which is the control center of the server cabinet 9. Furthermore, the server cabinet 9 can includes more other required electrical components, but the disclosure is not limited thereto.

Figure 3:
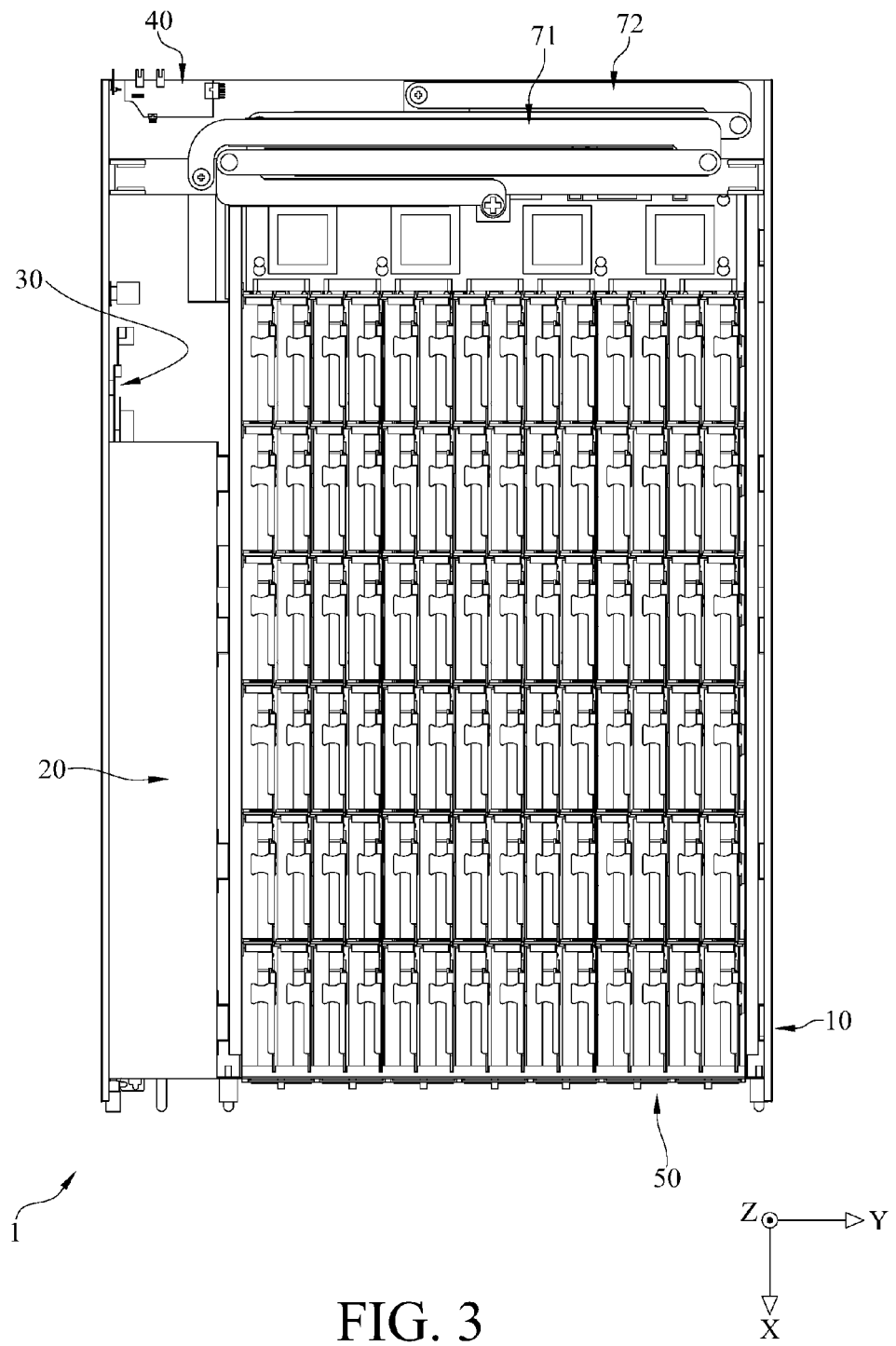
FIG. 3 is a top view of the server according to one embodiment of the disclosure.
Figure 4A:
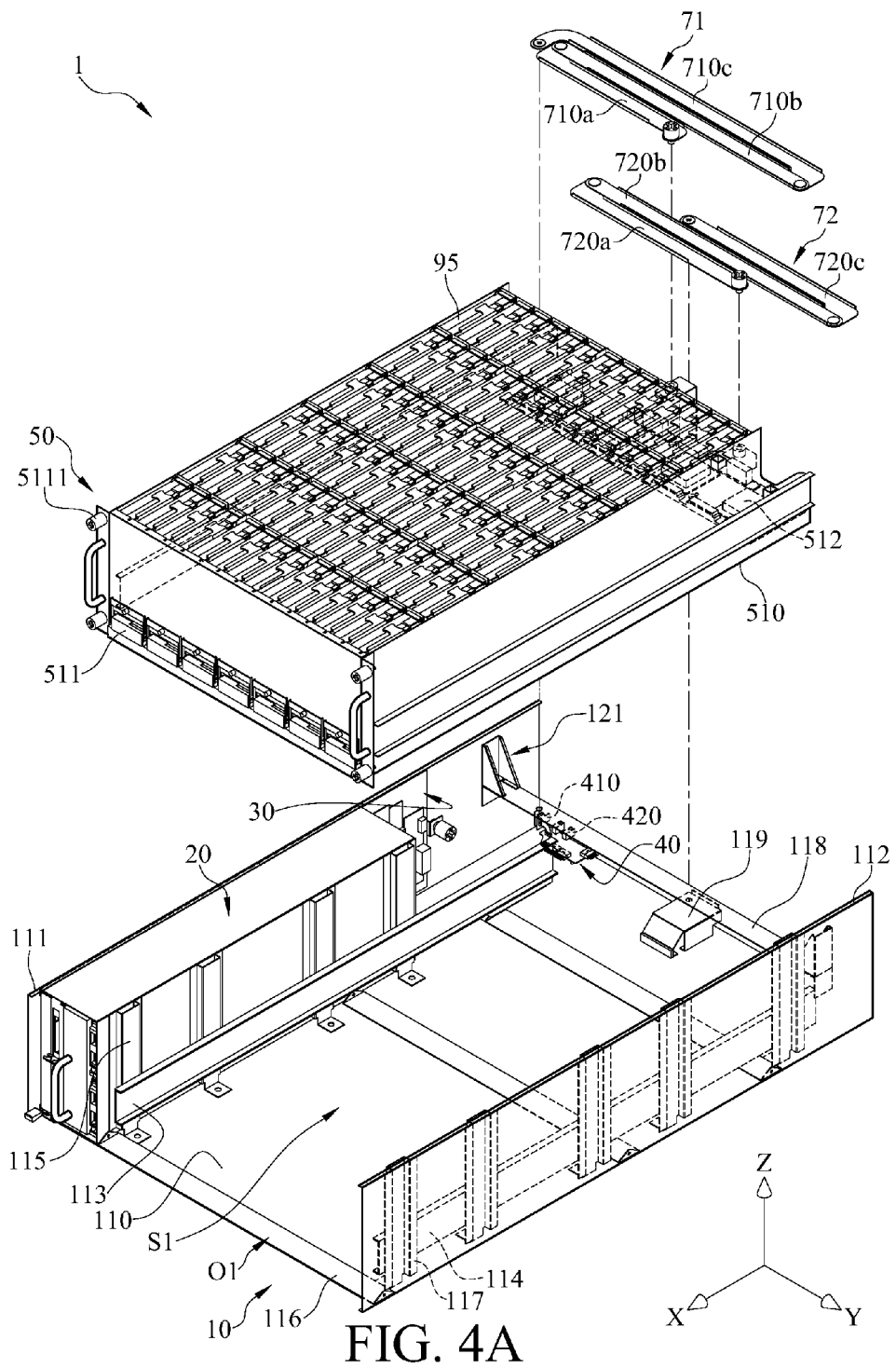
FIGS. 4A to 4B are exploded view of the server according to one embodiment of the disclosure taken from different viewpoints.
Figure 4B:
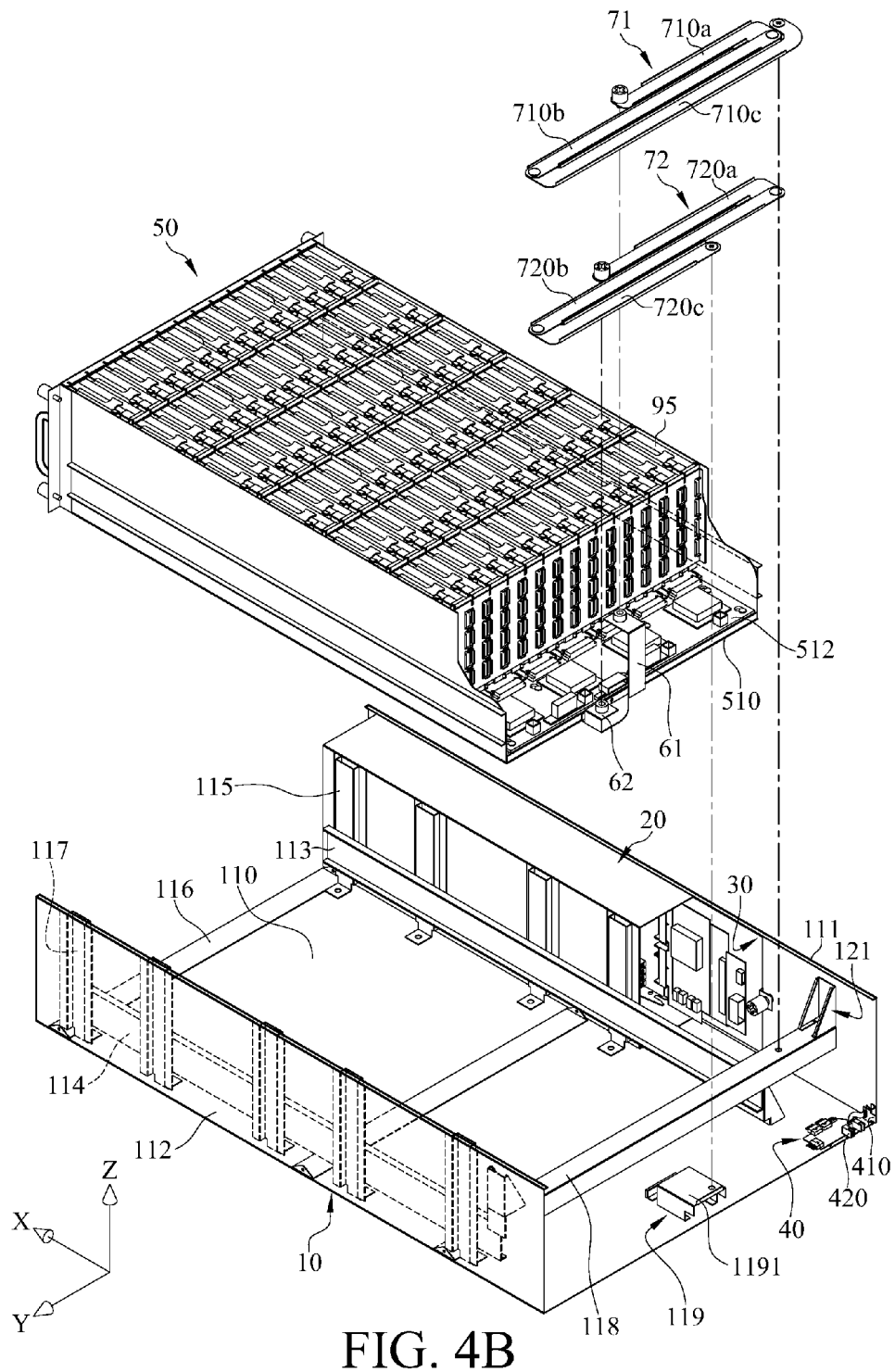
Figure 5:
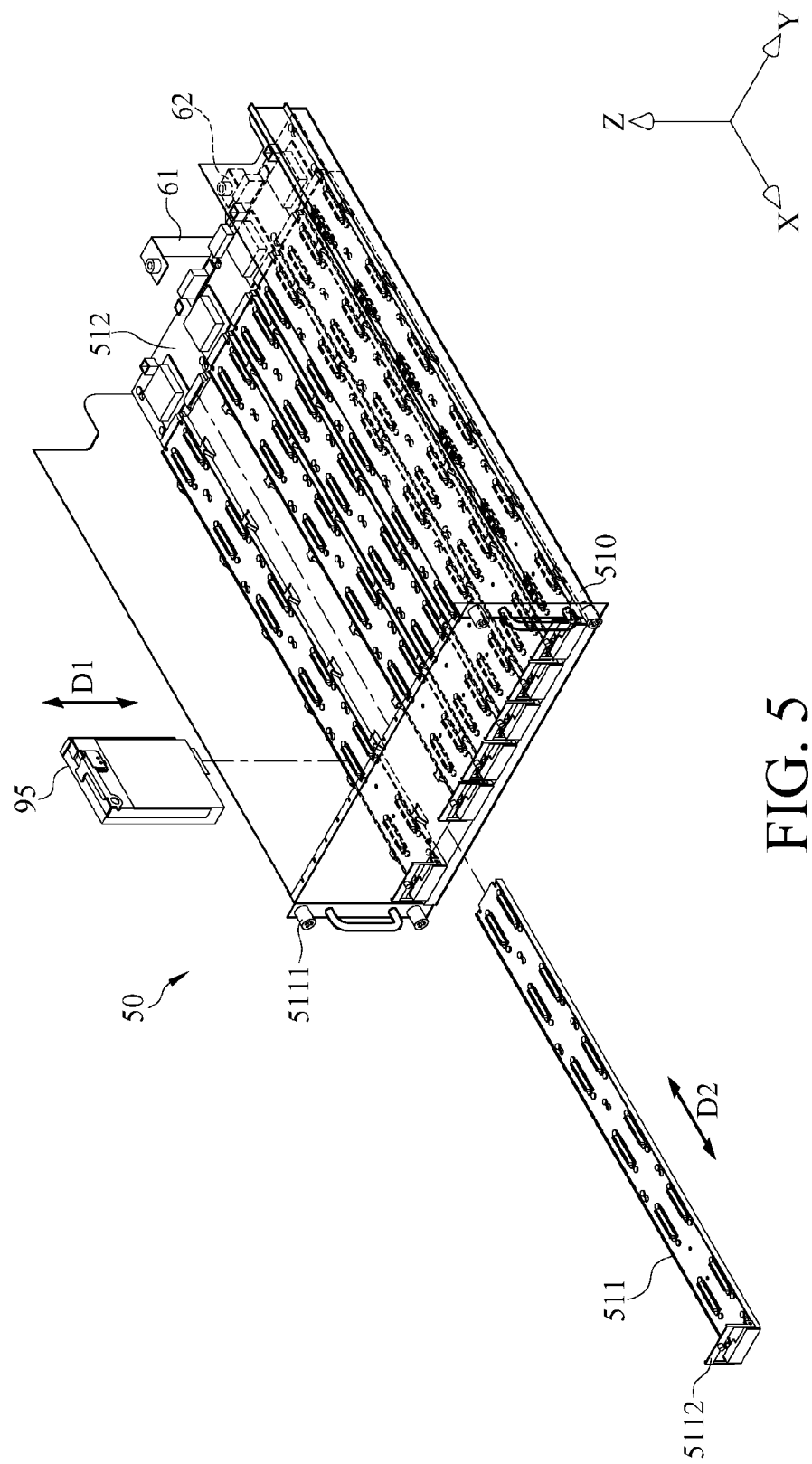
FIGS. 5 to 8 are partial enlarged view of the server according to one embodiment of the disclosure taken from different parts thereof.
Figure 6:
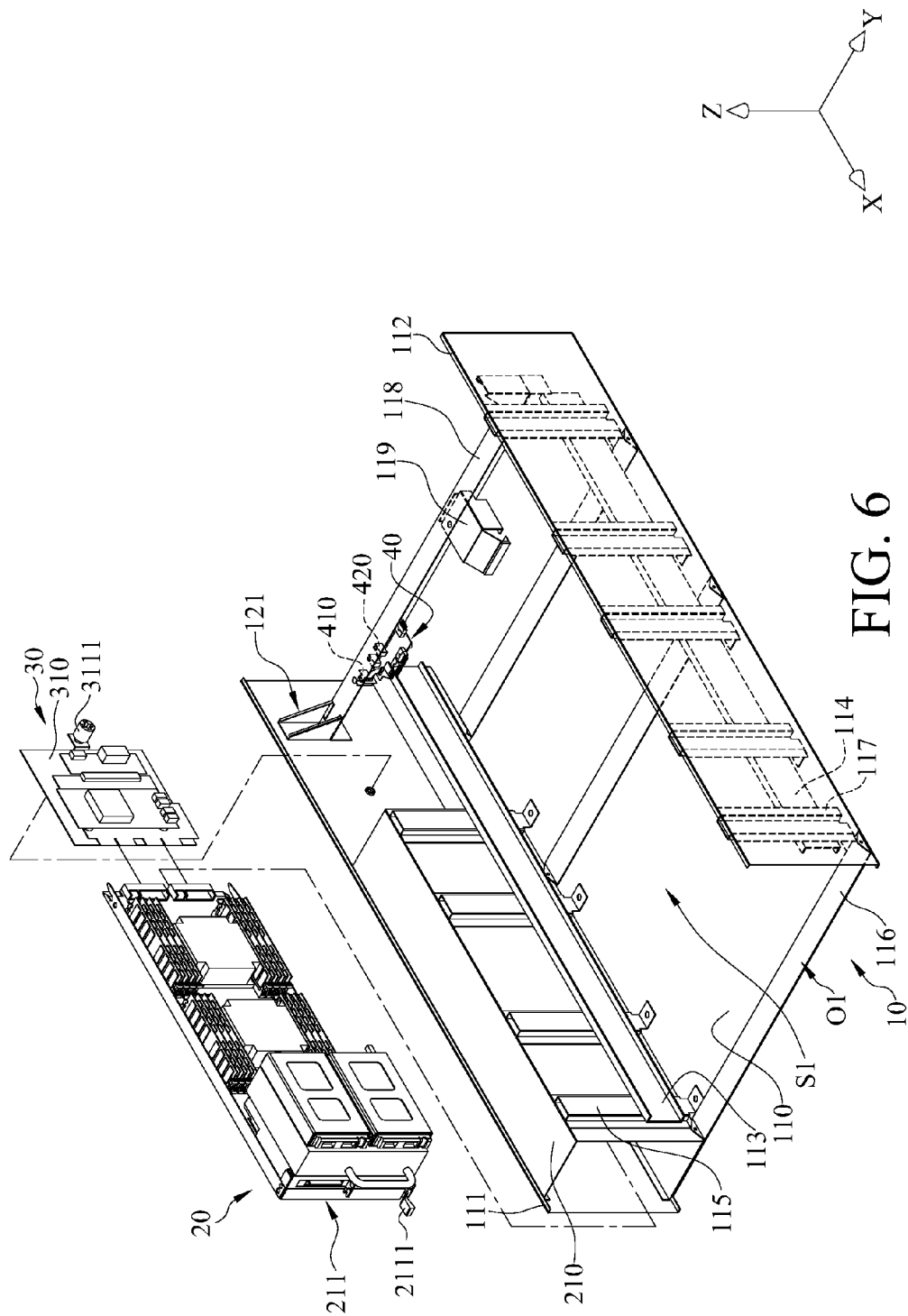
Figure 7:
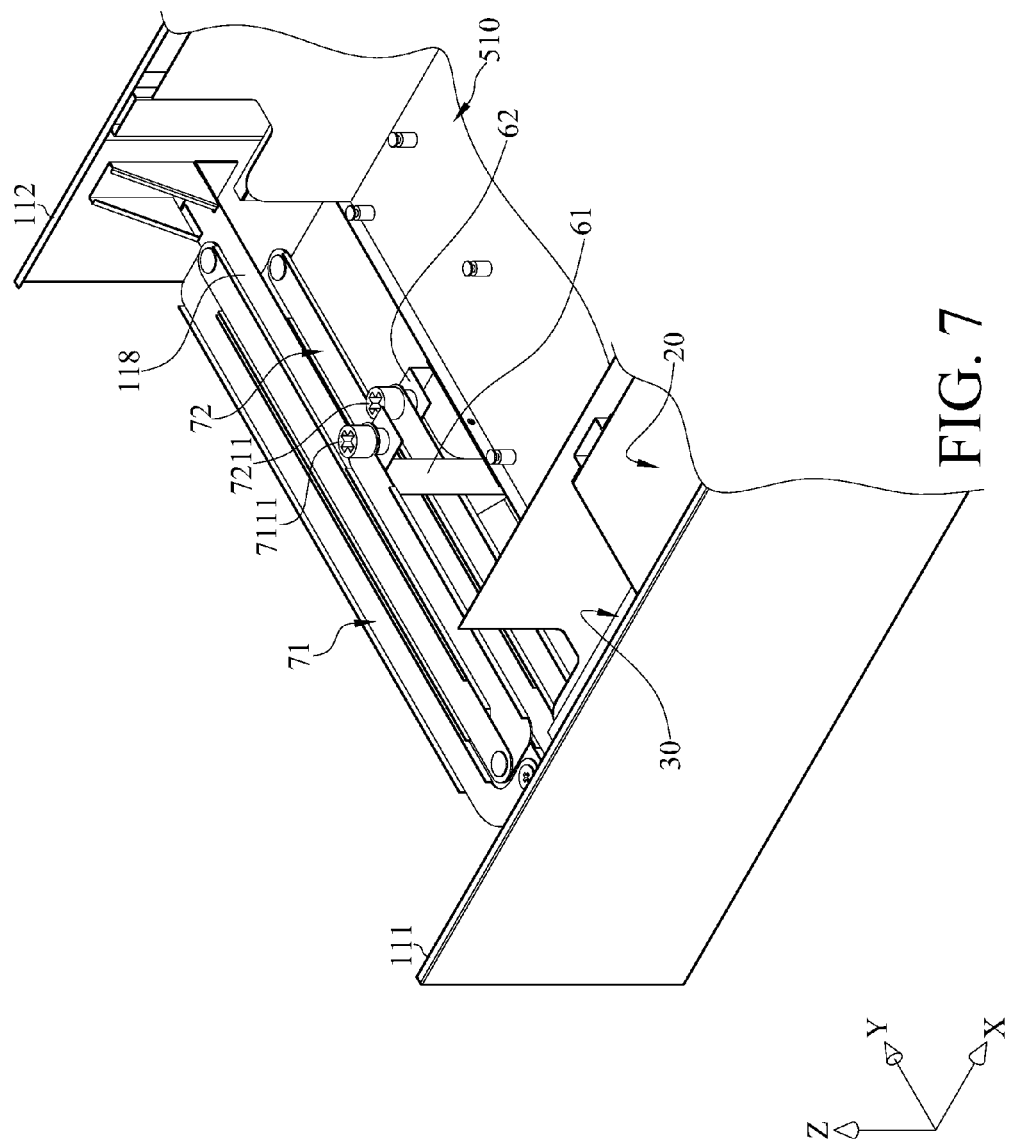
Figure 8:
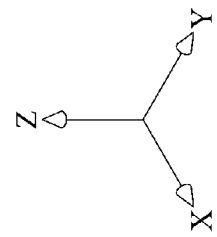
Figure 8:
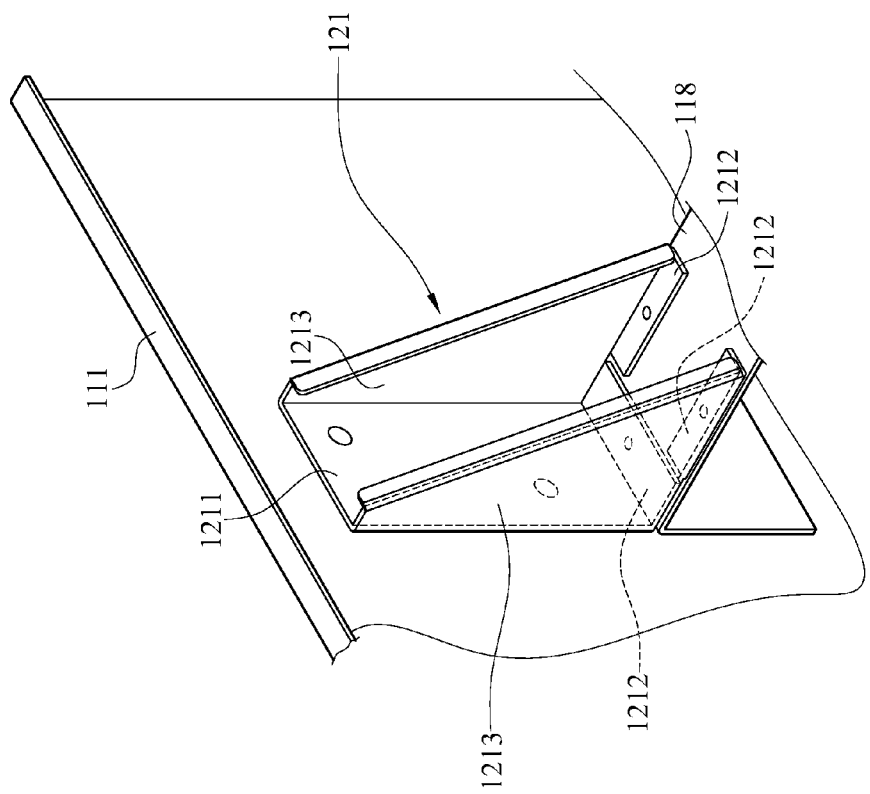
Figure 9:
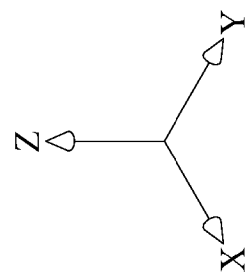
FIG. 9 is a perspective view of a supporting member according to one embodiment of the disclosure.
Figure 9:
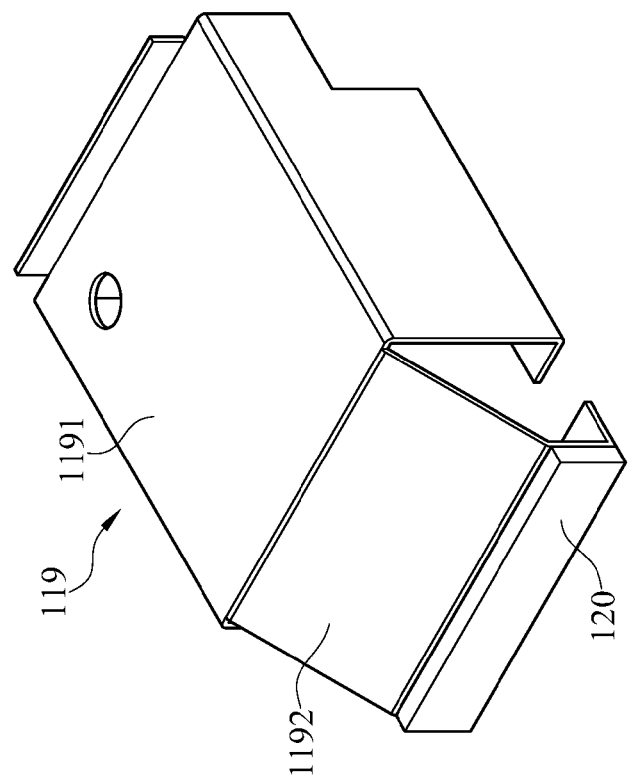

Then, the details of the server 1 are described in the following paragraphs. Please refer to FIGS. 2A to 9, FIGS. 2A to 2B are perspective views of the server according to one embodiment of the disclosure taken from different viewpoints, FIG. 3 is a top view of the server according to one embodiment of the disclosure, FIGS. 4A to 4B are exploded view of the server according to one embodiment of the disclosure taken from different viewpoints, FIGS. 5 to 8 are partial enlarged view of the server according to one embodiment of the disclosure taken from different parts thereof, and FIG. 9 is a perspective view of a supporting member according to one embodiment of the disclosure.

In this embodiment, the server 1 includes a chassis 10, a main board module 20, a signal-transferring module 30, a docking module 40, a data storage module 50, a first cable tray connector 61, a second cable tray connector 62, a first cable tray 71 and a second cable tray 72.

The chassis 10 is a metal structure that is used to house storages and other equipments. The chassis 10 can also be called a server casing or server case. In this embodiment, the chassis 10 includes a bottom plate 110, a first side plate 111 and a second side plate 112. The bottom plate 110, the first side plate 111 and the second side plate 112 are made of high-strength metal. The first side plate 111 and the second side plate 112 are respectively disposed on two opposite sides of the bottom plate 110. The first side plate 111, the second side plate 112 and the bottom plate 110 together form an accommodating space 51. The accommodating space 51 has an entrance O1, the data storage module 50 can be placed into the accommodating space 51 from the entrance O1.

The main board module 20 includes a main board container 210 and a main board unit 211. The main board container 210 is a case and its front and back are not sealed. The height of the main board container 210 is 1.5U, so the main board container 210 has a sufficient space for heat dissipation by comparing to the traditional one having height of 1 U. The main board container 210 is disposed on the bottom plate 110 and placed along the first side plate 111. The main board unit 211 is insertable into and removable from the main board container 210.

In detail, the main board unit 211 includes two 2.5 inches hard drives (not numbered), a main logic board (not numbered) and other electrical components. The 2.5 inches hard drives are disposed on a PCI-E card (not numbered) which has an input/output interface arranged vertically. In addition, the main board unit 211 includes a latch 2111 which can be fixed onto the main board container 210, so the user can fix the main board unit 211 into the main board container 210 and detach the main board unit 211 from the main board container 210 via the latch 2111 without using tool, and thereby the user can do the maintenance more efficiently.

The signal-transferring module 30 is placed along the first side plate 111 of the chassis 10 and located at the back of the main board module 20. The main board unit 211 of the main board module 20 can be connected to a side of the signal-transferring module 30 after being placed into the main board container 210.

In detail, the signal-transferring module 30 includes a bottom plate 310. There are an interposer board (not numbered) and other electrical components mounted on the bottom plate 310. In addition, there is a thumbscrew 3111 mounted on the bottom plate 310 for the user to fix the signal-transferring module 30 to the first side plate 111 and remove the signal-transferring module 30 from the first side plate 111 without using tool.

The docking module 40 is disposed on the bottom plate 110 of the chassis 10 and electrically connected to the signal-transferring module 30. In detail, the docking module 40 includes a docking board 410 and a locating unit 420. The docking board 410 is connectable to the power supply 93 on the server cabinet 9 for receiving electrical energy. The locating unit 420 is connectable to a locating device (not numbered) on the server cabinet 9 for determining the location of the server 1 on the server cabinet 9.

Then, in this embodiment, the chassis 10 further includes a first rail 113, a second rail 114, four first reinforcement members 115, three second reinforcement members 116, five third reinforcement members 117, a bridging member 118, a supporting member 119 and two rib members 121.

In this embodiment, the first reinforcement members 115, the second reinforcement members 116, the third reinforcement members 117, the bridging member 118 and the supporting member 119 are made of high-strength metal. In detail, each of the first reinforcement members 115 is a board structure fixed on a side of the main board container 210 of the main board module 20 facing the second side plate 112 via one or more rivets (not shown), and the four first reinforcement members 115 are spaced apart from one another and erect on the bottom plate 110. Each of the second reinforcement members 116 is a longer board structure fixed on the bottom plate 110 via one or more rivets, and the three second reinforcement members 116 are spaced apart from one another. The three second reinforcement members 116 can provide the bottom plate 110 with a high degree of flatness and dimensional stability. Each of the third reinforcement members 117 is also a board structure similar to the first reinforcement member 115. Each of the third reinforcement members 117 is fixed on a side of the second side plate 112 facing the first side plate 111 via one or more rivets (not shown), and the five third reinforcement members 117 are spaced apart from one another. The bridging member 118 is located on an end of the chassis 10 away from the entrance O1, that is, the bridging member 118 is located at the back of the chassis 10. The bridging member 118 is located above the bottom plate 110 and connected between the first side plate 111 and the second side plate 112. In detail, two opposite ends of the bridging member 118 are respectively fixed on the first side plate 111 and the second side plate 112 by using at least two screws on each end.

The rib members 121 are respectively located on the two opposite ends of the bridging member 118. In detail, as shown in FIG. 8, in this embodiment, each rib member 121 includes a first connecting plate 1211, three second connecting plates 1212 and two third connecting plates 1213. The first connecting plate 1211 can be fixed on the first side plate 111 or the second side plate 112 via at least two screws (not numbered). The two third connecting plates 1213 respectively erect on two opposite sides of the first connecting plate 1211. The three second connecting plates 1212 are fixed on the bridging member 118 by screwing, and the three second connecting plates 1212 are respectively connected to the first connecting plate 1211 and the two third connecting plates 1213. In addition, in this embodiment, in each rib member 121, the first connecting plate 1211, the second connecting plates 1212 and the third connecting plates 1213 are integrated into one piece. Therefore, the rib members 121 and the bridging member 118 together form a high strength structure at the back of the chassis 10 for enhancing structural strength of the chassis 10.

The supporting member 119 is disposed on an end of the bottom plate 110 away from the entrance O1. In detail, the supporting member 119 is located at the back of the chassis 10.

In this embodiment, the first rail 113 and the second rail 114 are made of high-strength metal as well, so the two rails 113 and 114 are capable of carrying very heavy loads. In detail, the first rail 113 is fixed on a side of the first reinforcement members 115 facing the second side plate 112. That is, the first rail 113 is fixed to the main board module 20 via the first reinforcement members 115. The second rail 114 is fixed on a side of the third reinforcement members 117 facing the first side plate 111. That is, the second rail 114 is fixed to the second side plate 112 via the third reinforcement members 117.

Accordingly, the chassis 10 is equipped with many reinforcement structures including nine metal boards (i.e. the first reinforcement members 115 and the third reinforcement members 117) erecting on two opposite sides of the chassis 10, three metal boards (i.e. second reinforcement members 116) lying on the bottom of the chassis 10, two metal structures (i.e. rails 113 and 114) extending from the front to the back of the chassis 10, one bridging (i.e. the bridging member 118) located across the back of the chassis 10 and two rib structures (i.e. rib members 121) for the bridging, so the structural strength of the chassis 10 is largely enhanced. Hence, the chassis 10 can carry lots of hard drives without bending or twisting. According to test results, the chassis 10 can carry up to 200 kilograms.

The data storage module 50 includes a hard drive tray 510, plural back plates 511 and an expansion plate 512. The hard drive tray 510 is a movable casing having a height of 4U, the hard drive tray 510 can accommodate lots of hard drives. In detail, there are plural partitions boards (not numbered) placed inside the hard drive tray 510, these partition boards divide the inner space of the hard drive tray 510 into many smaller spaces for accommodating hard drives. The hard drive tray 510 is placed along the second side plate 112 of the chassis 10. Two opposite sides of the hard drive tray 510 are respectively slidable disposed on the first rail 113 and the second rail 114, so the hard drive tray 510 is slidable with respect to the chassis 10. In addition, in this embodiment, there are four thumbscrews 5111 mounted on the front of the hard drive tray 510, and these thumbscrews 5111 respectively correspond to the first side plate 111 and the second side plate 112 of the chassis 10 and can be respectively fixed to the first side plate 111 and the second side plate 112, so the user is able to fix the hard drive tray 510 to the first side plate 111 and the second side plate 112 and remove the hard drive tray 510 from the first side plate 111 and the second side plate 112 via the thumbscrews 5111 without using tool.

The expansion plate 512 is disposed on an end of the hard drive tray 510. In detail, the expansion plate 512 is mounted on the back of the hard drive tray 510. The back plate 511 is insertable into the data storage module 50 to be connected to the expansion plate 512 along a second direction D2. In detail, the back plate 511 has a disconnected position and a connected position.

When the back plate 511 is located at the connected position, the back plate 511 is inserted into the data storage module and connected to the expansion plate 512 along the second direction D2. In such a case, the hard drive 95 can be inserted into the data storage module 50 along a first direction D1 perpendicular to the second direction D2 to be plugged into the port (not numbered) on the back plate 511. When the back plate 511 is located at the disconnected position, at least a part of the back plate 511 is removed from the data storage module 50, and the back plate 511 is disconnected with the expansion plate 512. The aforementioned hard drive 95 is, for example, a 3.5 inches hard drive. Furthermore, the front end of each back plate 511 has a pivotable handle 5112 for the user to pull out the back plate 511.

Then, in this embodiment, the first cable tray connector 61 is fixed on an end of the hard drive tray 510 close to the power supply 93 of the server cabinet 9. The first cable tray connector 61 is a C-shaped structure. The second cable tray connector 62 is fixed on the end of the hard drive tray 510 close to the power supply 93 as well, and the second cable tray connector is close to the first cable tray connector 61. The second cable tray connector 62 is a planar board protruding from the hard drive tray 510. In detail, the end of the first cable tray connector 61 is higher than the second cable tray connector 62.

Two opposite ends of the first cable tray 71 are respectively pivoted on the first cable tray connector 61 on the hard drive tray 510 and the bridging member 118. The first cable tray 71 can carry cables (not shown) connected among the data storage module 50, the main board module 20 and the signal-transferring module 30. In this embodiment, the first cable tray 71 includes three sub cable trays 710a, 710b and 710c. The sub cable tray 710a is pivoted on the first cable tray connector 61, the sub cable tray 710b is pivoted between the sub cable trays 710a and the 710c, and the sub cable tray 710c is pivoted on the bridging member 118. In other word, the three sub cable trays 710a, 710b and 710c can be pivoted with respect to one another. Thus, the sub cable trays 710a, 710b and 710c can be spread open or folded together. In more detail, the sub cable tray 710a is fixed on the first cable tray connector 61 via a thumbscrew 7111, so the user can fix the first cable tray 71 to the first cable tray connector 61 and detach the first cable tray 71 from the first cable tray connector 61 without using tool.

Two opposite ends of the second cable tray 72 are respectively pivoted on the second cable tray connector 62 on the hard drive tray 510 and a top surface 1191 of the supporting member 119. The second cable tray 72 can carry cables (not shown) connected among the data storage module 50, the main board module 20 and the signal-transferring module 30 as well. The configuration of the second cable tray 72 is similar to the first cable tray 71. In this embodiment, the second cable tray 72 includes three sub cable trays 720a, 720b and 720c. The sub cable tray 720a is pivoted on the second cable tray connector 62, the sub cable tray 720b is pivoted between the sub cable trays 720a and the 720c, and the sub cable tray 720c is pivoted on the top surface 1191 of the supporting member 119. In other words, the three sub cable trays 720a, 720b and 720c can be pivoted with respect to one another. Thus, the sub cable trays 720a, 720b and 720c can be spread open or folded together. In more detail, the sub cable tray 720a is fixed on the second cable tray connector 62 via a thumbscrew 7211, so the user can fix the second cable tray 72 to the second cable tray connector 62 and detach the second cable tray 72 from the second cable tray connector 62 without using tool.

Accordingly, the data storage module 50 can be electrically connected to the main board module 20, the signal-transferring module 30 and the docking module 40 via cables.

Furthermore, since the end of the first cable tray connector 61 is higher than the second cable tray connector 62, and the bridging member 118 is located above the supporting member 119, the first cable tray 71 is located above the second cable tray 72. That is, the first cable tray 71 is located above the second cable tray 72.

Figure 10:
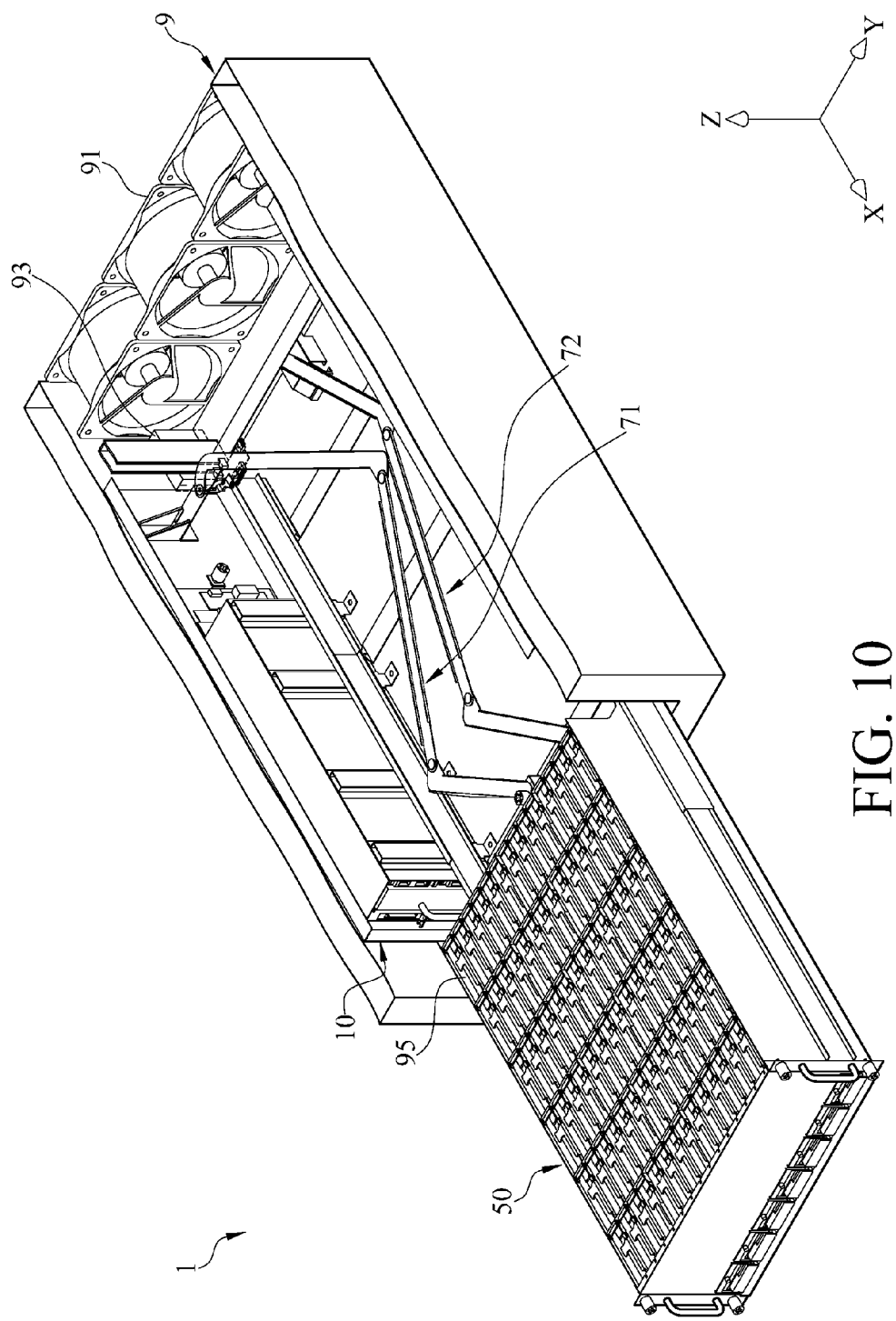
FIG. 10 shows the usage of the server according to one embodiment of the disclosure.

Then, please refer to FIG. 10, FIG. 10 shows the usage of the server according to one embodiment of the disclosure. When the data storage module 50 is drawn out from the chassis 10, the data storage module 50 can pull the first cable tray 71 and the second cable tray 72 to spread open. It is noted that the first cable tray 71 and the second cable tray 72 do not interfere with each other during the movement since the first cable tray 71 is located above the second cable tray 72. In addition, under this arrangement, it is favorable for arranging cables, and the length of single cable is reduced. According to measurement result, the length of the cable on the single cable tray is about 80 centimeters, so the length of the cables used in the server 1 are about 1.6 meters in total, which is not too long for transmitting signal.

In addition, in this embodiment, the back plates 511 are seven in number, and each of the back plates 511 has twelve ports (not numbered). Under this configuration, the data storage module 50 can accommodate eighty four hard drives 95. According to measurement result, the data storage module 50 carrying eighty four hard drives 95 weights about 100 kilogram. According to the aforementioned description, the chassis 10 is capable of carrying 200 kilograms, so the chassis 10 is not bent or twisted when the data storage module 50 full with the hard drives 95 is slide relative to the chassis 10. The chassis 10 is maintained in a high degree of flatness and dimensional stability, so the position of the locating unit 420 of the server 1 will not be changed, and thereby the locating unit 420 can be still connected to the locating device on the server cabinet 9 during the movement of the data storage module 50. In real condition, the length of the data storage module 50 being pulled out of the chassis 10 is about 825 millimeters, even the last row of the hard drives 95 (i.e. the hard drives 95 closest to the power supply 93) can be pulled out of the chassis 10, so the user can do the maintenance more efficiently.

Since the first cable tray 71 and the second cable tray 72 are respectively fixed on the first cable tray connector 61 and the second cable tray connector 62 via the thumbscrew 7111 and the thumbscrew 7211. The user can easily disconnect the data storage module 50 with the first cable tray 71 and the second cable tray 72 and take out the data storage module 50 from the server 1. In addition, the taken out data storage module 50 can be mounted with two handles (not shown) on its two sides for the user to carry it.

Then, please refer back to FIGS. 2A and 9. In this embodiment, the chassis 10 further includes a buffering member 120. The buffering member 120 is made of plastic material, such as rubber, but the disclosure is not limited thereto. The buffering member 120 is disposed on a side of the supporting member 119 which faces the entrance O1 and is close to the bottom plate 110. The buffering member 120 is configured for absorbing impact when the data storage module 50 presses against the supporting member 119.

In addition, the supporting member 119 has a guiding slope 1192 adjacent to the top surface 1191 and located on a side of the supporting member 119 which faces the entrance O1 and is located away from the bottom plate 110. When the data storage module 50 is slide into the chassis 10, the data storage module 50 forces the first cable tray 71 and the second cable tray 72 to fold to the back of the chassis 10, the guiding slope 1192 of the supporting member 119 can guide the second cable tray 72 to slide up the supporting member 119 for maintaining the distance between the second cable tray 72 and the bottom plate 110. Therefore, the docking board 410 and the locating unit 420 of the docking module 40 are prevented from being hit by the folded second cable tray 72.

According to the server as discussed above, the data storage module is operatable by being connected to the docking module, the signal-transferring module and the main board module, and members for heat dissipation and electricity distribution to the server are integrated into the server cabinet. Therefore, there has a large amount of space for accommodating the data storage module in single server so that the data storage module is allowed to be designed bigger for accommodating more hard drives, and thereby achieving a high-density server.

In addition, the chassis of the server is equipped with many high strength reinforcement metals, so the structural strength of the chassis is largely enhanced such that a maximum weight which the chassis is able to carry is at least twice the weight of the data storage module when the data storage is full of hard drives. Thus, the chassis is not bent or twisted during the movement of the data storage module full of the hard drives, and the position of the locating unit of the server will not be changed to disconnect with the server cabinet.

Furthermore, since the first cable tray is located above the second cable tray, it is favorable for arranging cables, and the length of single cable is reduced so that the cable is not too long for the signal to be transmitted.

Moreover, the main board unit, the signal-transferring module and the cable trays can be fixed or detached without tool, so the user can do the maintenance more efficiently.

While this disclosure has been described in terms of several preferred embodiments, there are alterations, permutations, and equivalents, which fall within the scope of this disclosure. It should also be noted that there are many alternative ways of implementing the methods and apparatuses of the present disclosure. It is therefore intended that the following appended claims be interpreted as including all such alterations, permutations, and equivalents as fall within the true spirit and scope of the present disclosure.

What is claimed is:

1. A server adapted to a server cabinet, the server cabinet comprising a fan assembly and a power supply, the server comprising:
    a chassis having a bottom plate, a first side plate and a second side plate, the first side plate and the second side plate respectively disposed on two opposite sides of the bottom plate;
    a main board module disposed on the bottom plate and placed along the first side plate;
    a data storage module disposed on the bottom plate and placed along the second side plate for accommodating a plurality of hard drives, each of the plurality of hard drives is insertable into and removable from the data storage module along a first direction;
    a signal-transferring module disposed on the bottom plate and placed along the first side plate, the signal-transferring module located at the back of the main board module, the signal-transferring module electrically connected between the main board module and the data storage module; and
    a docking module disposed on the bottom plate, the docking module electrically connected to the data storage module and the signal-transferring module, the docking module connectable to the power supply and the fan assembly of the server cabinet for heat dissipation and receiving electrical energy;
    wherein, the data storage module is operatable by being connected to the docking module, the signal-transferring module and the main board module.

2. The server according to claim 1, wherein the data storage module comprises at least one back plate, there is a second direction perpendicular to the first direction, the at least one back plate is insertable into and removable from the data storage module along the second direction to be either at a connected position or a disconnected position; when the at least one back plate is located at the connected position, the at least one back plate is inserted into and connected to the data storage module so that each of the plurality of hard drives is insertable into the data storage module along the first direction to be connected to the at least one back plate.

3. The server according to claim 2, wherein the data storage module further comprises an expansion plate for being electrically connected to the at least one back plate.

4. The server according to claim 1, wherein the chassis further comprises a first rail and a second rail, the first rail is located on a side of the main board module facing the first side plate, the second rail is disposed on the second side plate, and two opposite sides of the data storage module are respectively slidably disposed on the first rail and the second rail.

5. The server according to claim 4, wherein the chassis further comprises at least one first reinforcement member, at least one second reinforcement member, at least one third reinforcement member and a bridging member, the at least one first reinforcement member is erected on the bottom plate, the first rail is connected to the main board module via the first reinforcement member, the at least one second reinforcement member is disposed on the bottom plate, the second rail is connected to the second side plate via the at least one third reinforcement member, the bridging member is connected between the first side plate and the second side plate, the bridging member is located on an end of the chassis away from an entrance of the chassis and is spaced apart from the bottom plate.

6. The server according to claim 5, wherein the chassis further comprises two rib members respectively located on two opposite ends of the bridging member, each of the rib members comprises a first connecting plate, three second connecting plates, and two third connecting plates, the first connecting plate is fixed on one of the first side plate and the second side plate, the two third connecting plates are respectively fixed on two opposite sides of the first side plate, the three second connecting plates are fixed on the bridging member and respectively connected to the first connecting plate and the two third connecting plates.

7. The server according to claim 5, further comprising a first cable tray and a second cable tray, two ends of the first cable tray respectively pivoted on the data storage module and the bridging member, two ends of the second cable tray respectively pivoted on the data storage module and a top surface of a supporting member disposed on an end of the chassis away from the entrance.

8. The server according to claim 7, wherein the supporting member has a guiding slope faces the entrance and is located away from the bottom plate, for maintaining a distance between the second cable tray and the bottom plate.

9. The server according to claim 7, wherein the chassis further comprises a buffering member disposed on a side of the supporting member which faces the entrance and is close to the bottom plate, for absorbing impact when the data storage module presses against the supporting member.

10. The server according to claim 7, wherein each of the first cable tray and the second cable tray comprises at least three sub cable trays pivoted to each other, when the data storage module is moved with respect to the chassis, the data storage module drives the sub cable trays of the first cable tray and the second cable tray to fold or spread open.

* * * * *